US009286990B1

(12) United States Patent
Lee et al.

(10) Patent No.: US 9,286,990 B1
(45) Date of Patent: Mar. 15, 2016

(54) STORAGE DEVICE, NONVOLATILE MEMORY AND METHOD OPERATING SAME

(71) Applicant: SAMSUNG ELECTRONICS CO., LTD., Suwon-Si, Gyeonggi-Do (KR)

(72) Inventors: Chul Lee, Hwaseong-Si (KR); Nam Wook Kang, Hwaseong-Si (KR); In Hwan Doh, Seoul (KR); Chanik Park, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/677,420

(22) Filed: Apr. 2, 2015

(30) Foreign Application Priority Data

Dec. 22, 2014 (KR) .......................... 10-2014-0186298

(51) Int. Cl.
*G11C 16/26* (2006.01)
*G11C 16/16* (2006.01)
*G11C 16/32* (2006.01)

(52) U.S. Cl.
CPC .............. *G11C 16/16* (2013.01); *G11C 16/32* (2013.01)

(58) Field of Classification Search
CPC ......... G11C 16/26; G11C 16/10; H01L 29/00
USPC .......................... 365/185.11, 185.24; 711/103
See application file for complete search history.

(56) References Cited

U.S. PATENT DOCUMENTS

| 6,000,006 | A * | 12/1999 | Bruce et al. .................. 711/103 |
| 6,694,460 | B2 | 2/2004 | Katayama et al. |
| 7,257,668 | B2 * | 8/2007 | Chan et al. .................... 711/103 |
| 7,441,067 | B2 * | 10/2008 | Gorobets et al. .............. 711/103 |
| 7,451,264 | B2 * | 11/2008 | Yero .............................. 711/103 |
| 7,679,133 | B2 | 3/2010 | Son et al. |
| 8,028,121 | B2 | 9/2011 | Jeong |
| 8,254,172 | B1 | 8/2012 | Kan |
| 8,344,475 | B2 * | 1/2013 | Shaeffer et al. ............... 257/528 |
| 8,347,024 | B2 | 1/2013 | Sato |
| 8,473,668 | B2 | 6/2013 | Kim et al. |
| 8,553,466 | B2 | 10/2013 | Han et al. |
| 8,559,235 | B2 | 10/2013 | Yoon et al. |
| 8,583,858 | B2 | 11/2013 | Honda |
| 8,654,587 | B2 | 2/2014 | Yoon et al. |
| 2007/0245068 | A1 * | 10/2007 | Yero .............................. 711/103 |
| 2011/0233648 | A1 | 9/2011 | Seol et al. |
| 2011/0238892 | A1 | 9/2011 | Tsai et al. |

(Continued)

FOREIGN PATENT DOCUMENTS

| JP | 2007193867 | 8/2007 |
| JP | 2009009279 | 1/2009 |
| JP | 2009087173 | 4/2009 |

(Continued)

*Primary Examiner* — Michael Tran
(74) *Attorney, Agent, or Firm* — Volentine & Whitt, PLLC

(57) ABSTRACT

A method of operating a storage device includes; counting a number of fast cycles for the memory block when a program interval between two successive program operations directed to memory cells of the memory block is less than a minimal program interval, and/or when an erase interval between two successive erase operations directed to the memory block is less than a minimal erase interval, and selecting the memory block to be erased by an erase operation or selecting memory cells of the memory block to be programmed by a program operation in response to the counted number of fast cycles for the memory block.

20 Claims, 14 Drawing Sheets

(56) References Cited

U.S. PATENT DOCUMENTS

2012/0317337 A1   12/2012   Johar et al.
2014/0289458 A1*  9/2014    Lassa .......................... 711/103

FOREIGN PATENT DOCUMENTS

JP        2010205167        9/2010
JP        2012212312        11/2012

* cited by examiner

| | Number of Erases (NOE) | Number of Fast Cycles (NOF) | Time Stamp (TS) | Wear Index (WI) |
|---|---|---|---|---|
| BLK1 | 2 | 0 | TS3 | WI3 |
| BLK2 | 3 | 0 | TS4 | WI4 |
| BLK3 | 2 | 0 | TS2 | WI2 |
| BLK4 | 1 | 0 | TS1 (Lowest or Oldest) | WI1 (Lowest) |
| BLK5 | 3 | 0 | TS5 | WI5 |
| BLK6 | 4 | 0 | TS6 | WI6 |
| BLK7 | 10 | 6 | TS8 (Highest or Newest) | WI8 (Highest) |
| BLK8 | 9 | 5 | TS7 | WI7 |

…

STORAGE DEVICE, NONVOLATILE MEMORY AND METHOD OPERATING SAME

CROSS-REFERENCE TO RELATED PATENT APPLICATION

This application claims priority under 35 U.S.C. §119 to Korean Patent Application 10-2014-0186298 filed on Dec. 22, 2014, the subject matter of which is hereby incorporated by reference.

BACKGROUND

The inventive concept relates generally to nonvolatile memory devices, storage devices or memory systems including at least one nonvolatile memory device, and methods of operating same. More particularly, the inventive concept relates to methods of operating nonvolatile memory devices in memory systems that better address possible problems of data reliability.

Nonvolatile memory device have become an important and staple component in contemporary memory systems, such as those typically used in computers, smartphones and other portable, personal electronic devices. Nonvolatile memory devices include, for example, Read Only Memory (ROM), Programmable ROM (PROM), Electrically Programmable ROM (EPROM), Electrically Erasable and Programmable ROM (EEPROM) such as flash memory, Phase-change Random Access Memory (PRAM), Magnetic RAM (MRAM), Resistive RAM (RRAM), and Ferroelectric RAM (FRAM).

Design, fabrication and operating goals for contemporary nonvolatile memory devices are characterized by very dense memory cell integration, fast operating speeds, reduced current consumption and reduced manufacturing costs. Unfortunately, as the physical size of individual memory cells and the physical spacing between adjacent and proximate memory cells in a memory cell array are reduced to meet these design goals, the reliability of stored data may be impaired.

SUMMARY

According to an embodiment of the inventive concept, a method of operating a storage device including a memory controller and a nonvolatile memory including a memory block includes; counting a number of fast cycles for the memory block when a program interval between two successive program operations directed to memory cells of the memory block is less than a minimal program interval, and when an erase interval between two successive erase operations directed to the memory block is less than a minimal erase interval, and selecting the memory block to be erased by an erase operation or selecting memory cells of the memory block to be programmed by a program operation in response to the counted number of fast cycles for the memory block.

According to another embodiment of the inventive concept, a method of operating a storage device including a memory controller and a nonvolatile memory including a plurality of memory blocks, includes; respectively counting a number of fast cycles for each one of the plurality of memory blocks when a program interval between two successive program operations directed to memory cells of each memory block is less than a minimal program interval, and when an erase interval between two successive erase operations directed to each of the memory blocks is less than a minimal erase interval, calculating a wear index for each one of the plurality of memory blocks based on the counted number of fast cycles for each one of the plurality of memory blocks, and a number of erase operations directed to each one of the plurality of memory blocks, and selecting a memory block from among the plurality of memory blocks to be erased by an erase operation or selecting memory cells of the memory block to be programmed by a program operation in response to the counted number of fast cycles for the selected memory block.

According to another embodiment of the inventive concept, a method of operating a nonvolatile memory device having a memory cell array divided into memory blocks includes; counting a number of fast cycles for each one of the memory blocks when a program interval between two successive program operations directed to memory cells of each memory block is less than a minimal program interval, and when an erase interval between two successive erase operations directed to each memory block is less than a minimal erase interval, and selecting a memory block among the memory blocks to be erased by an erase operation or selecting memory cells of the memory block to be programmed by a program operation in response to the counted number of fast cycles for the memory block.

BRIEF DESCRIPTION OF THE DRAWINGS

The above and other features of the inventive concept will become more apparent upon consideration of certain embodiments thereof with reference to the accompanying drawings in which.

DETAILED DESCRIPTION

Certain embodiments of the inventive concepts will now be described in some additional detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Throughout the written description and drawings, like reference numbers and labels are used to denote like or similar elements.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The use of the terms "a" and "an" and "the" and similar referents in the context of describing the inventive concept, especially in the context of the following claims, are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

In the description that follows, the terms "erase operation time" and "program operation time" used in the context of various embodiments of the inventive concept respective mean a point in time at which an erase operation and a program operation is complete.

Figure 1:
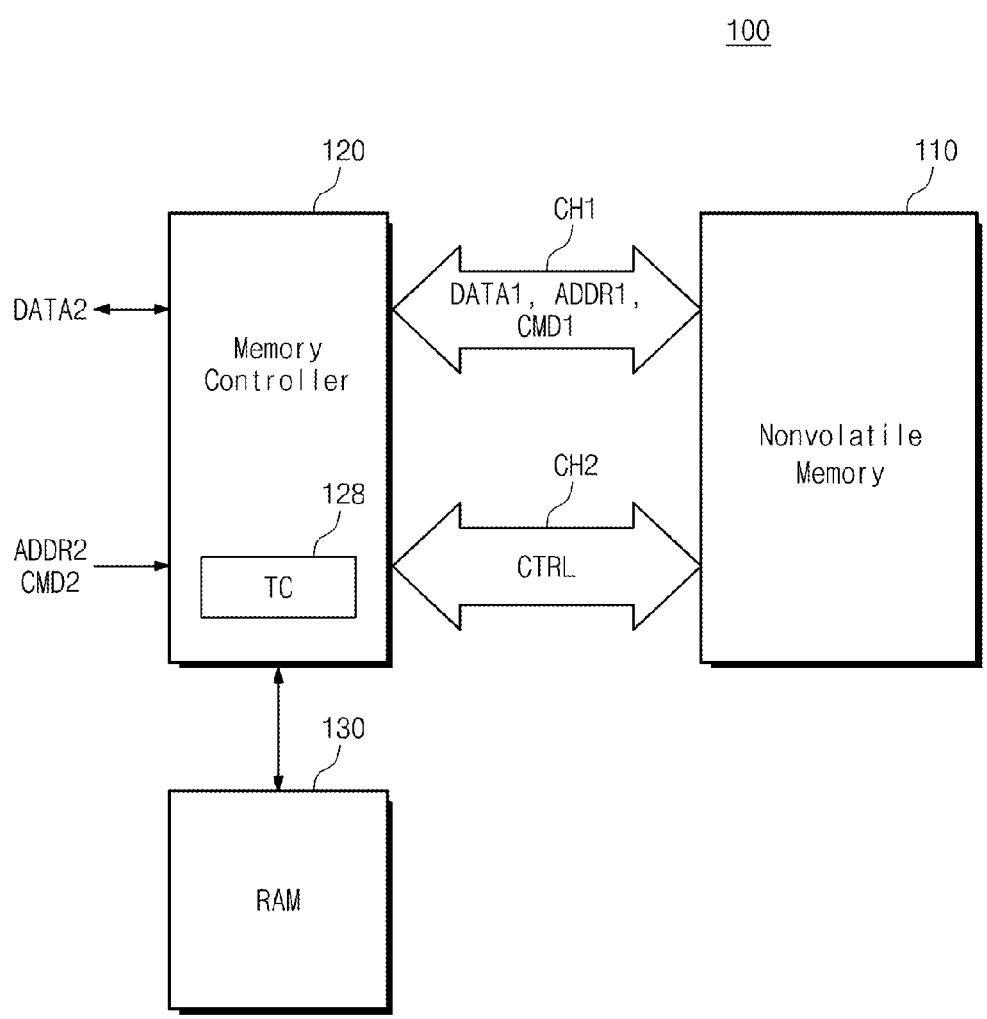
FIG. 1 is a block diagram illustrating a storage device according to an embodiment of the inventive concept.

Figure (FIG. 1 is a block diagram illustrating a storage device 100 according to an embodiment of the inventive concept. Referring to FIG. 1, the storage device 100 comprises a nonvolatile memory 110, a memory controller 120, and a memory 130. The memory 130 may include at least one Random Access Memory (RAM) such as a Dynamic RAM (DRAM), a Static RAM (SRAM), a Synchronous DRAM (SDRAM), a Phase-change RAM (PRAM) and a Ferroelectric RAM (FRAM).

The nonvolatile memory 110 may perform read, program (or write), and erase operations under the control of the memory controller 120, where the nonvolatile memory 110 and memory controller 120 are configured to variously communicates first data DATA1. For example, during a program operation the nonvolatile memory 110 will receive the first data DATA1, along with a corresponding first command CMD1 and a first address ADDR1, from the memory controller 120 and store the first data DATA1. During a read operation, the nonvolatile memory 110 will retrieve and provide the first data DATA1 to the memory controller 120, in response to the first command CMD1 and first address ADDR1.

During one or more of the read, program and/or erase operations, the nonvolatile memory 110 and memory controller 120 may communicate one or more control signal(s) CTRL. For example, the memory controller 120 may provide the nonvolatile memory 110 with at least one control signal, such as a chip enable signal /CE, a command latch enable signal CLE, a address latch enable signal ALE, a read enable signal /RE, a write enable signal /WE, a write protection signal /WP, and a data strobe signal DQS. The chip enable signal /CE may be a chip selection signal that selects between a plurality of semiconductor memory chips constituting the nonvolatile memory 110. The command latch enable signal CLE indicates that a signal received from the memory controller 120 is the first command CMD1. The address latch enable signal CLE indicates that a signal which is received from the memory controller 120 is the first address ADDR1. The read enable signal /RE is received from the memory controller 120 and toggles periodically to control data read out timing during a read operation. The write enable signal /WE may be a enable signal which is received from the memory controller 120 when a command or an address is communicated from the memory controller 120 to the nonvolatile memory 110. The write protection signal /WP indicates that the nonvolatile memory 110 will be protected from being unintentionally programmed or erased when a power supply voltage of the nonvolatile memory 110 is interrupted. The data strobe signal DQS is communicated from the memory controller 120 to the nonvolatile memory 110 and toggles periodically to control data write timing during a write operation directed to the nonvolatile memory 110.

In addition, the nonvolatile memory 110 may communicate a ready/busy signal R/nB to the memory controller 120, where the ready/busy signal R/nB indicates that the nonvolatile memory 110 is in a busy state during execution of a read, write or erase operation. The nonvolatile memory 110 may also communicate a data strobe signal DQS to the memory controller 120 to indicate read out timing when the memory controller 120 toggles the read enable signal /RE periodically to read the nonvolatile memory 110.

As illustrated in FIG. 1, the first data DATA1, first address ADDR1, and first command CMD1 may be communicated via a first channel CH1 (or input/output channel) connecting the memory controller 120 and the nonvolatile memory 110, whereas the control signal CTRL may be communicated via a second channel CH2 (or control channel) separately connecting the memory controller 120 and nonvolatile memory 110.

The nonvolatile memory 110 may be configured to include one or more of a flash memory, a Phase-change RAM (PRAM), a Magnetic RAM (MRAM), a Resistive RAM (PRAM) and a Ferroelectric RAM (FRAM).

The memory controller 120 is configured to control the operation of the nonvolatile memory 110 in relation to one or more of the first data DATA1, control signal CTRL, first command CMD1 and/or first address ADDR1. Here, the memory controller 120 may control the operation of the nonvolatile memory 110 in response to requests from a host device (not shown in FIG. 1). Thus, the memory controller 120 may exchange data, command(s), and/or address(es) with the host device. For example, the memory controller 120 may communicate first data (as well as first command(s) and first address(es)) in accordance with a first data communications format or protocol using a first unit (e.g., a time unit, or a data unit) to the nonvolatile memory 110, while communicating second data (as well as second command(s) and second address(es)) in accordance with a second data communications format or protocol using a second unit different from the first unit to the host device.

The memory controller 120 may use the memory 130 as a buffer memory, a cache memory, or a working memory. For example, during a program operation the memory controller 120 may receive second data from the host device, store the received second data in the memory 130, and then write the second data stored in the memory 130 to the nonvolatile memory 110 as first data DATA1. During a read operation, the memory controller 120 may read the first data DATA1 from the memory 130, store the read first data DATA1 in the memory 130, and then output the first data DATA1 to the host device as second data.

The memory controller 120 may store programming code and/or related data to control the nonvolatile memory 110 in the memory 130. For example, the memory controller 120 may load code and data used to control the nonvolatile memory 110 from the nonvolatile memory 110 to the memory 130, and later execute the stored code and data in the memory 130.

In the embodiment illustrated in FIG. 1, the memory controller 120 includes a time calculator 128. The time calculator 128 may be used to calculate "local time" for the storage device 100 and/or "global time" associated with the operation of a host device functionally incorporating the storage device 100. Hence, local time is 'time' that is defined and used within the storage device 100. For example, while the storage device 100 is supplied with operating power, the time calculator 128 may be used to calculate local time for the storage device 128. In certain embodiments, external time information may be provided to the memory controller 120 from the host device. In the foregoing example, when operating power is interrupted and then resumed, the time calculator 128 may be used to defined or maintain local time based on an internal clock source disposed in the storage device 128. Here, the time calculator 128 may further be used to restore local time by referring to a time period associated with interruption of the operating power.

In contrast with local time, global time is 'time' defined and used by a host device, such as a host device functionally incorporating the storage device 100. For example, the time calculator 128 may be used to maintain local time according to some synchronization with global time established by some circuit in the host device. In this context, "synchronous local time" is time having a period derived from a period associated with global time. Thus, in certain embodiments of the inventive concept, global time will be defined according to a real clock time.

In the context of local time, therefore, the time calculator 128 may be used to calculate one or more time interval(s), wherein a "time interval" is a period of time measured (or counted) between a first (start) time and a second (end) time.

To reduce overhead associated with execution of erase operations in the nonvolatile memory 110, the storage device 100 may perform an address mapping. For example, when the storage device 100 receives an update request from the host device, the storage device 100 may store data in a free memory block instead of a target address designated by the update request to thereby avoid the erase operation otherwise necessary for updating of the data at the target address. In this regard, the memory controller 120 may use a Flash Translation Layer (FTL) to map a logical address received from the host device into a physical address of the storage device 100. Thus, a second address received from the host device as a logical address may be converted to the first address ADDR1 used to store corresponding data at a physical address of the nonvolatile memory 110.

In certain embodiments of the inventive concept, the storage device 100 may be implemented as a Solid State Drive (SSD) or a Hard Disk Drive (HDD). The storage device 100 may include a memory card having a standard interface such as a Personal Computer Memory Card International Association (PCMCIA), a Compact Flash (CF), a Secure Digital (SD) including a SD, a miniSD, a microSD, or a SDHC, a Universal Serial Bus (USB), a Universal Flash Storage (UFS), etc.

Figure 2:
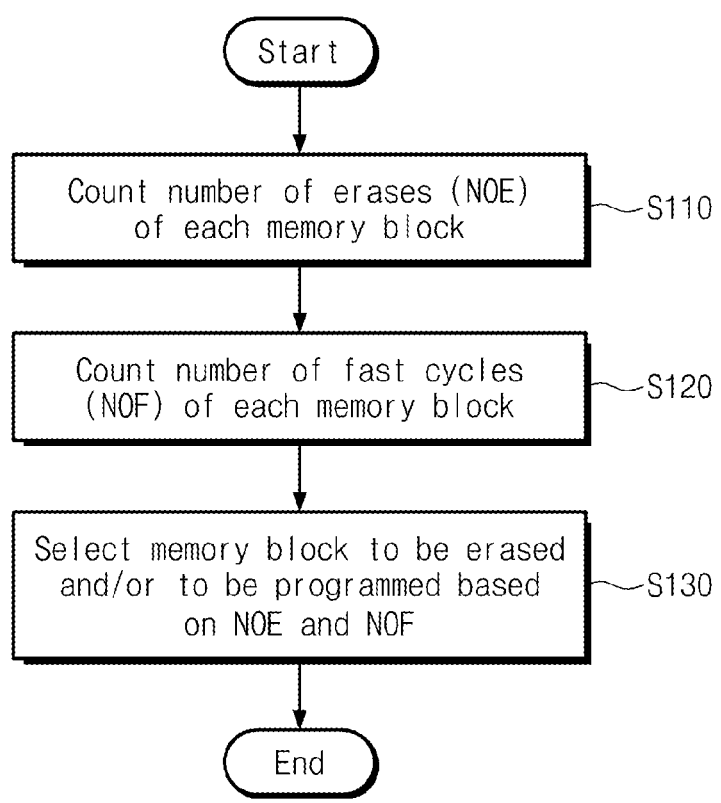
FIG. 2 is a flowchart summarizing an operation sequence of a storage device according to an embodiment of the inventive concept.

FIG. 2 is a flowchart summarizing operation of the storage device 100 described in relation to FIG. 1 further assuming that the constituent memory cell array of the nonvolatile memory 100 is divided into a plurality of memory blocks. Referring to FIGS. 1 and 2, the memory controller 120 is used to count a number of erase operations NOE that have been executed for each one of the plurality of memory blocks in the nonvolatile memory 110 (S110).

Then, the memory controller 120 is used to count a number of fast cycles NOF for each one of the plurality of memory blocks in the nonvolatile memory 110 (S120). Here, the term "fast cycle" is used to denote a phenomenon wherein a time interval between two erase operations executed in relation (or directed) to the same memory block is less than a first limit. The term "fast cycle" is also used to denote another, similar phenomenon wherein a time interval between two program operations executed in relation (or directed) to the same physical address within a memory block is less than a second limit. The foregoing time intervals associated with successive erase or program operations may be determined using an approach referred to as a "counted number of fast cycles". Examples of a counted number of fast cycles NOF will be described hereafter in some additional detail.

Returning to FIG. 2, the memory controller 120 may also be used to select a memory block to be erased or a memory block to be programmed based respectively on the counted number of erase operations NOE and the counted number of fast cycles NOF (S130). Here, despite the illustration of both steps S110 and S120 in the example of FIG. 2, where the memory controller 120 in certain embodiments of the inventive concept may perform only one of these steps to respectively select a memory block to be erased or to select a memory block to be programmed based in view of either the counted number of erase operations NOE or the counted number of fast cycles NOF.

Figure 3:
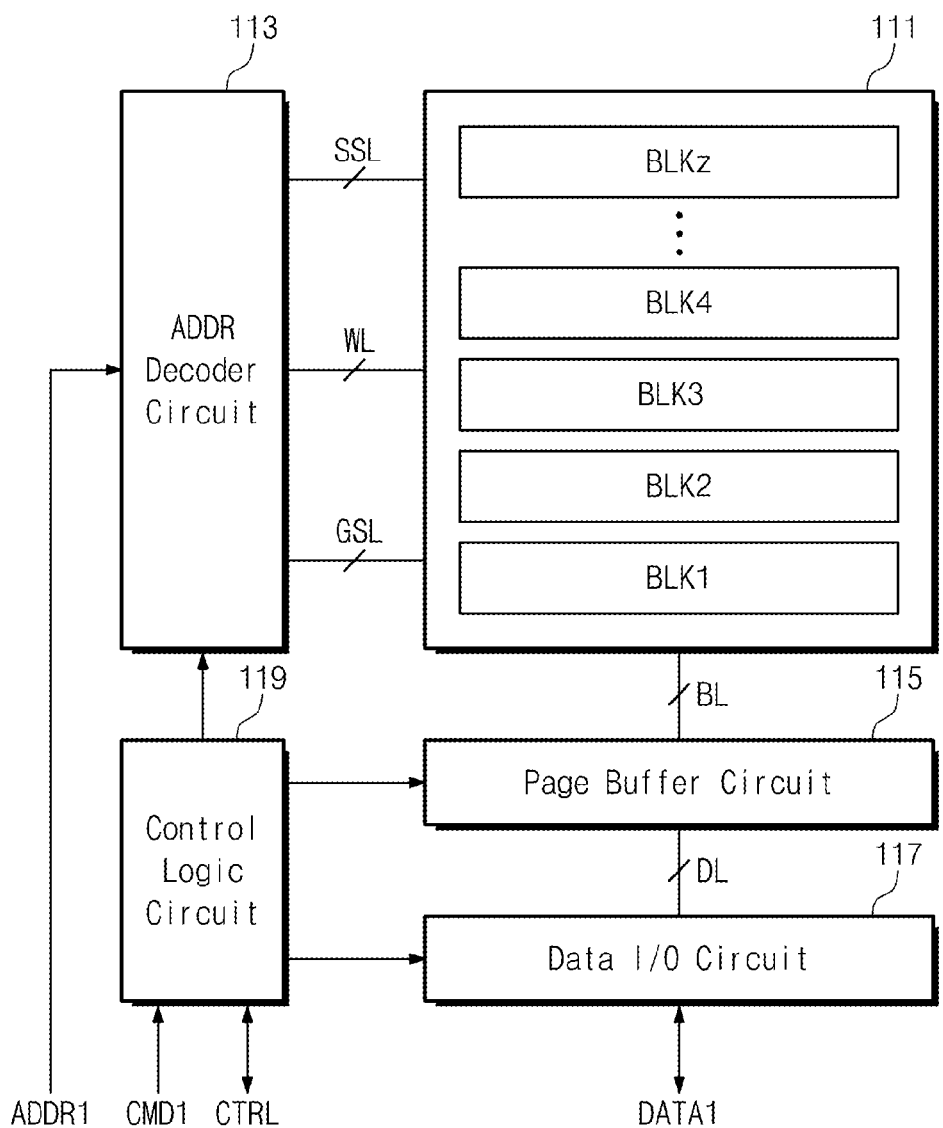
FIG. 3 a block diagram further illustrating the nonvolatile memory 110 of FIG. 3.

FIG. 3 is a block diagram further illustrating in one example the nonvolatile memory 110 of FIG. 1 according to an embodiment of the inventive concept. Referring to FIGS. 1 and 3, the nonvolatile memory 110 comprises a memory cell array 111, an address decoder circuit 113, a page buffer circuit 115, a data input/output circuit 117, and a control logic circuit 119.

As suggested above, the memory cell array 111 may include a plurality of memory blocks BLK1 to BLKz. Each memory block BLK1 to BLKz may include a plurality of memory cells. Each memory block BLK1 to BLKz may be connected to the address decoder circuit 113 through at least one ground selection line GSL, a plurality of word lines WL, and at least one string selection line SSL. Each memory block BLK1 to BLKz may be connected to the page buffer circuit 115 through a plurality of bit lines BL. The plurality of memory blocks BLK1 to BLKz may share the plurality of bit lines BL and may be connected to the plurality of bit lines BL in common. Each memory block BLK1 to BLKz may have the same structure as other memory block, and may become an erase unit for erase operation. The plurality of memory cells of the memory cell array 111 may be erased by a unit of a memory block. The plurality of memory cells of a memory block may be erased simultaneously. In addition, each memory block BLK1 to BLKz may be divided into a plurality of sub-memory blocks. The plurality of memory cells of the memory cell array 111 may be erased by a unit of a sub-memory block.

The address decoder circuit 113 may be connected to the memory cell array 111 through a plurality of ground selection lines GSL, a plurality of word lines WL, and a plurality of string selection lines SSL. The address decoder 113 may be controlled by the control logic circuit 119. The address decoder circuit 113 may receive a first address ADDR1 from the memory controller 120. The address decoder circuit 113 may decode the received first address ADDR1 and control a plurality of voltages of the plurality of word lines WL according to the first address ADDR1. For example, at a program operation, the address decoder circuit 113 may supply a program voltage VPGM to a selected word line of a selected memory block pointed by the first address ADDR1, and supply a pass voltage VPASS to a plurality of unselected word lines of the selected memory block. At a read operation, the address decoder circuit 113 may supply a selection read voltage VRD to a selected word line of a selected memory block pointed by the first address ADDR1, and supply a unselected read voltage VREAD to a plurality of unselected word lines of the selected memory block. At an erase operation, the address decoder circuit 113 may supply a erase voltage, e.g., a ground voltage, to a plurality of word lines of a selected memory block pointed by the first address ADDR1.

A page buffer circuit 115 may be connected to the memory cell array 111 through the plurality of bit lines BL. The page buffer circuit 115 may be connected to the data input/output circuit 117 through a plurality of data lines DL. The page buffer circuit 115 is controlled by the control logic circuit 119.

The page buffer circuit 115 may store data to be programmed to the plurality of memory cells of the memory cell array 111 or data read from the plurality of memory cells of the memory cell array 111. The page buffer circuit 115 may bias the plurality of bit lines BL based on the stored data in the page buffer circuit 115. The page buffer circuit 115 may control biases of the plurality of bit lines BL at a program operation, and sense voltages of the plurality of bit lines BL, magnify the sensed voltages and store the sensing result at a read operation.

The data input/output circuit 117 may temporarily store data received from the memory controller 120 and transmit the stored data to the page buffer circuit 115. The data input/output circuit 117 may temporarily store data received from the page buffer circuit 115 and transmit the stored data to memory controller 117. The data input/output circuit 117 may operate as a buffer memory.

The control logic circuit 119 may receive a first command CMD1 and a control signal CTRL. The control logic circuit 119 may decode the received first command CMD1 and control the operations of the nonvolatile memory 110. For example, the control logic circuit 119 may generate a data strobe signal DQS and output the data strobe signal DQS according to a read enable signal /RE of a plurality of control signals CTRL at a read operation. The control logic circuit 119 may receive the data strobe signal DQS and control the data input/output circuit 117 to store data according to the data strobe signal DQS.

Figure 4:
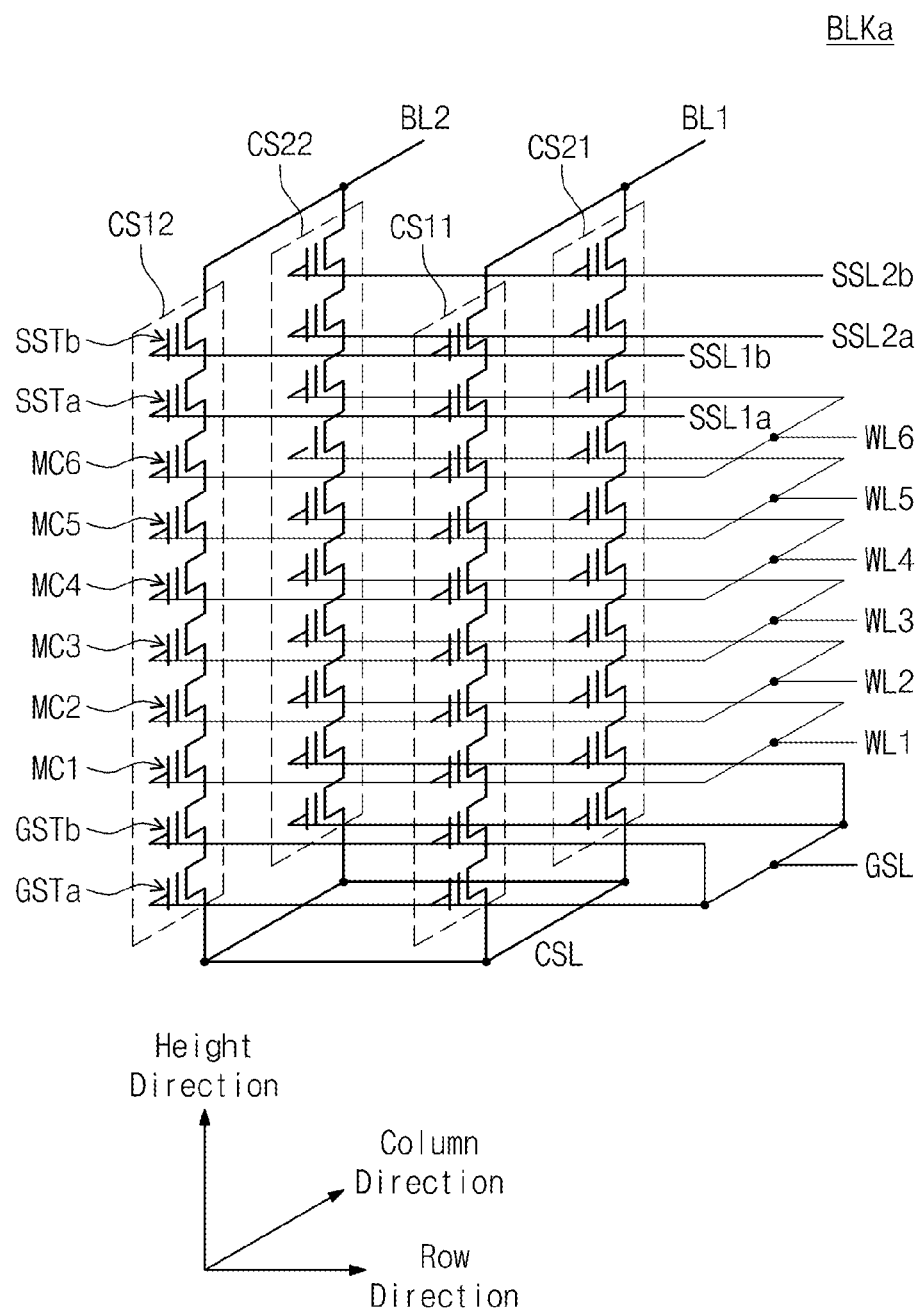
FIG. 4 is a partial circuit diagram illustrating a memory block according to an embodiment of the inventive.

FIG. 4 is a partial circuit diagram illustrating in one example a three-dimensional (3D) memory block BLKa that may be used in certain embodiments of the inventive concept.

Referring to FIG. 4, a memory block BLKa includes a plurality of cell strings CS11 to CS21 and CS12 to CS22. The plurality of cell strings CS11 to CS21 and CS12 to CS22 are arranged along a row direction and a column direction and form rows and columns.

For example, the cell strings CS11 and CS12 arranged along the row direction form a first row, and the cell strings CS21 and CS22 arranged along the row direction form a second row. The cell strings CS11 and CS21 arranged along the column direction form a first column, and the cell strings CS12 and CS22 arranged along the column direction form a second column.

Each cell string contains a plurality of cell transistors. The cell transistors include ground selection transistors GSTa and GSTb, memory cells MC1 to MC6, and string selection transistors SSTa and SSTb. The ground selection transistors GSTa and GSTb, memory cells MC1 to MC6, and string selection transistors SSTa and SSTb of each cell string are stacked in a height direction perpendicular to a plane (e.g., plane above a substrate of the memory block BLKa) on which the cell strings CS11 to CS21 and CS12 to CS22 are arranged along rows and columns.

Each cell transistor may be formed of a charge trap type cell transistor of which the threshold voltage varies with the amount of charge trapped in its insulation layer.

Lowermost ground selection transistors GSTa are connected in common to a common source line CSL.

The ground selection transistors GSTa and GSTb of the plurality of cell strings CS11 to CS21 and CS12 to CS22 are connected in common to a ground selection line GSL.

In certain embodiments of the inventive concept, ground selection transistors with the same height (or, order) may be connected to the same ground selection line, and ground selection transistors with different heights (or, orders) may be connected to different ground selection lines. For example, the ground selection transistors GSTa with a first height are connected in common to a first ground selection line, and the ground selection transistors GSTb with a second height are connected in common to a second ground selection line. The ground selection transistors in the same row may be connected to the same ground selection line, and ground selection transistors in different rows may be connected to different ground selection lines. For example, the ground selection transistors GSTa and GSTb of the cell strings CS11 and CS12 in the first row are connected in common to the first ground selection line and the ground selection transistors GSTa and GSTb of the cell strings CS21 and CS22 in the second row are connected in common to the second ground selection line.

Memory cell may be commonly connected to a word line that is disposed at a height (or, order) from the substrate (or, the ground selection transistors GST). Connected to different word lines WL1 to WL6 are memory cells that are placed at different heights (or, orders). For example, the memory cells MC1 are connected in common to the word line WL1, the memory cells MC2 are connected in common to the word line WL2, and the memory cells MC3 are connected in common to the word line WL3. The memory cells MC4 are connected in common to the word line WL4, the memory cells MC5 are connected in common to the word line WL5, and the memory cells MC6 are connected in common to the word line WL6.

In first string selection transistors SSTa, having the same height (or, order), of the cell strings CS11 to CS21 and CS12 to CS22, the first string selection transistors SSTa in different rows are connected to different string selection lines SSL1a and SSL2a. For example, the first string selection transistors SSTa of the cell strings CS11 and CS12 are connected in common to the string selection line SSL1a, and the first string selection transistors SSTa of the cell strings CS21 and CS22 are connected in common to the string selection line SSL2a.

In second string selection transistors SSTb, having the same height (or, order), of the cell strings CS11 to CS21 and CS12 to CS22, the second string selection transistors SSTb in different rows are connected to the different string selection lines SSL1a and SSL2a. For example, the second string selection transistors SSTb of the cell strings CS11 and CS12 are connected in common to the string selection line SSL1b, and the second string selection transistors SSTb of the cell strings CS21 and CS22 are connected in common to the string selection line SSL2b.

That is, cell strings in different rows may be connected to different string selection lines. String selection transistors, having the same height (or, order), of cell strings in the same row may be connected to the same string selection line. String selection transistors, having different heights (or, orders), of cell strings in the same row may be connected to different string selection lines.

In certain embodiments of the inventive concept, string selection transistors of cell strings in the same row may be connected in common to a string selection line. For example, string selection transistors SSTa and SSTb of cell strings CS11 and CS12 in the first row are connected in common to a string selection line, and string selection transistors SSTa and SSTb of cell strings CS21 and CS22 in the second row are connected in common to a string selection line.

Columns of the cell strings CS11 to CS21 and CS12 to CS22 are connected to different bit lines BL1 and BL2, respectively. For example, string selection transistors SSTb of the cell strings CS11 and CS21 in the first column are connected in common to the bit line BL1, and string selection transistors SSTb of the cell strings CS12 and CS22 in the second column are connected in common to the bit line BL2.

The memory block BLKa shown in FIG. 4 is merely one example of many different architectures that may be used to arrange a memory cell array. For example, the number of rows of cell strings may increase or decrease. If the number of rows of cell strings is changed, the number of string or ground selection lines and the number of cell strings connected to a bit line may also be changed.

The number of columns of cell strings may increase or decrease. If the number of columns of cell strings is changed, the number of bit lines connected to columns of cell strings and the number of cell strings connected to a string selection line may also be changed.

A height of the cell strings may increase or decrease. For example, the number of ground selection transistors, memory cells, or string selection transistors that are stacked in each cell string may increase or decrease.

In embodiments, reading and writing may be performed by the row. The cell strings CS11 to CS21 and CS12 to CS22 may be selected by the row by controlling activation of the string selection lines SSL1a, SSL1b, SSL2a, and SSL2b.

In a selected row of the cell strings CS11 to CS21 and CS12 to CS22, writing and reading is performed by the word line. In a selected row of the cell strings CS11 to CS21 and CS12 to CS22, memory cells connected with a selected word line may be programmed.

The 3D memory cell array shown in the example of FIG. 4 is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In various embodiments of the inventive concept, a 3D memory cell array may include vertical NAND strings that are vertically oriented such that at least one memory cell is located over another memory cell, where the at least one memory cell comprises a charge trap layer. Each vertical NAND string further includes at least one select transistor located over memory cells, the at least one select transistor having the same structure with the memory cells and being formed monolithically together with the memory cells.

Those skilled in the art will recognize that many different three-dimensional (vertical) and two-dimensional (horizontal) memory cell array architectures might be used to implement memory cell array 111 including multiple memory blocks. In this regard, U.S. Pat. Nos. 7,679,133; 8,553,466; 8,654,587; 8,559,235; as well as published U.S. Patent Application 2011/0233648—the collective subject matter of which is hereby incorporated by reference—may be referenced as examples of suitable configurations for three-dimensional memory cell arrays in which the three-dimensional memory cell array is configured to include multiple levels with word lines and/or bit lines shared between levels.

Figure 5:
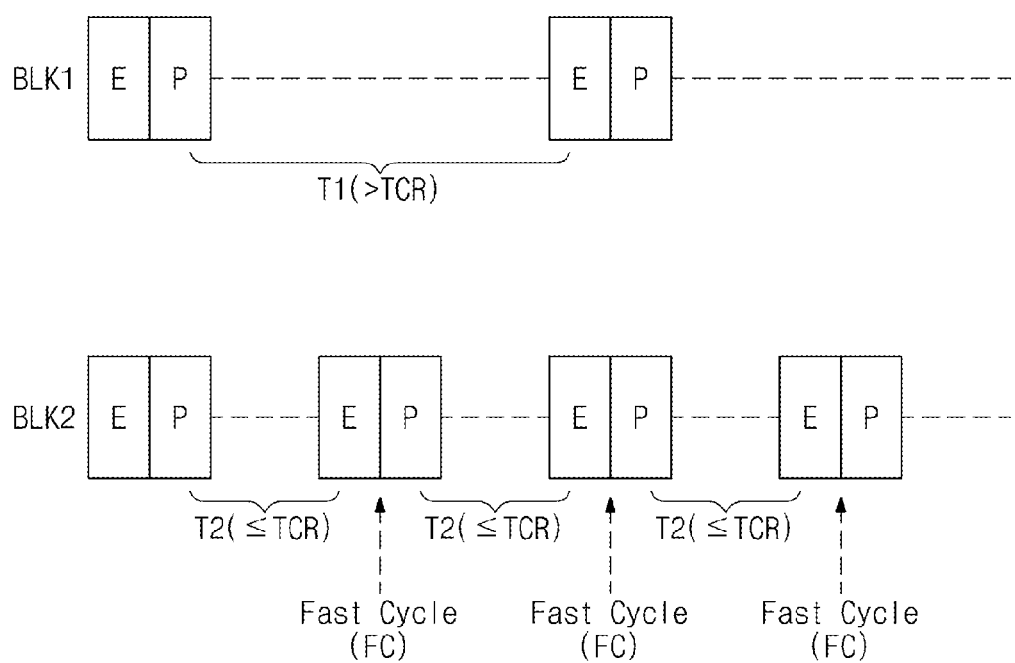
FIG. 5 is a conceptual diagram illustrating a sequence of program and erase operations executed in relation to memory blocks.

FIG. 5 is a conceptual diagram illustrating one possible sequence of program operations 'P' and erase operations 'E' executed in relation to a first memory block BLK1 and a second memory block BLK2.

Referring collectively to FIGS. 1, 2, 3, 4 and 5, a first time interval T1 exists between first and second erase operations and first and second program operations directed to the first memory block BLK1. The first time interval T1 may be greater than an establish first limit TCR. In contrast, when a second time interval T2 between two erase operations directed to a second memory block BLK2 is determined to be less than the first limit TCR, a fast cycle associated with the second memory block BLK2 is detected. Additionally, when the second time interval T2 between two program operations directed to the same physical address in the second memory block BLK2 is determined to be less than a second limit, a fast cycle associated with the second memory block BLK2 is detected. Thus, the circumstances illustrated in relation to the first memory block BLK1 of FIG. 5 do not cause an increment in the counted number of fast cycles NOF, but the circumstances illustrated in relation to the second memory block BLK2 of FIG. 5 do cause increments in the counted number of fast cycles NOF.

In view of the foregoing, certain embodiments of the inventive concept provide methods of controlling the interval time between two program operations and/or two erase operations directed to the same memory block, and such methods may be used to improve the reliability of data stored in the storage device 100. In this regard, when a target memory cell of a memory block is programmed, some electrical charge may become trapped in one or more isolation layer(s) of the target memory cell, or one or more isolation layer(s) of memory cell(s) proximate the target memory cell. This charge trapping may occur when charge moves from a base channel to a floating gate of the target memory cell during a programming operation, for example. Thereafter, assuming that the target memory cells is left alone in its programmed state (i.e., the target memory cell is maintained in its programmed state without further access and update over some period of time greater than the limit TCR), the amount of trapped charge will decrease over the time period. However, if the previously programmed target memory cell is again accessed by an erase operation and/or a program operation during the "minimal interval" established by the limit TCR, then some amount of trapped charge remains and can be erroneously accumulated, thereby threatening the validity of the stored data when accessed by a following read operation.

A "minimal program interval" between two successive program operations may be the minimal time interval between a previous program operation and a next program operation following an erase operation (i.e., an updating program operation) for a selected word line of a selected memory block among the plurality of memory blocks in the nonvolatile memory 110 that will avoid the fast cycle phenomenon. Here, the selected word line may be a first word line, any one of a number of middle word lines, or a last word line within the selected memory block. For example, a minimal program interval between two successive program operations may be a time interval between a first average time point for a previous program operation and a second average time point of a next program operation following an erase operation directed to the same memory cells of a selected memory block. Therefore, any program interval between successive program operations directed to the same memory cells less than the minimal program interval will be detected or counted as a fast cycle for the selected memory block.

A "minimal erase interval" between two successive erase operations may be a minimal time interval between a previous erase operation and a next erase operation directed to a selected memory block that will avoid the fast cycle phenomenon. Any erase interval between successive erase operations directed to the same memory block less than the minimal erase interval will be detected or counted as a fast cycle for the selected memory block.

Returning to FIG. 5, the second intervals T2 between two program operations directed to the same memory cells of the second memory block (BLK2) are each less than the minimal program interval. Thus, the counted number of fast cycles NOF associated with the second memory block BLK2 will be increased per incident. Similarly, the second intervals T2 between two erase operations directed to the second memory block (BLK2) are each less than the minimal erase interval. Thus, the counted number of fast cycles NOF associated with the second memory block BLK2 will be further increased per incident.

Here, it should be noted that the counted number of fast cycles NOF may very well be different from a counted number of executed erase operations NOE for a particular memory block which will increment every time an erase operation is directed to the particular memory block. In contrast, the counted number of fast cycles NOF is incremented only when an interval between two successive erase operations falls below the minimal erase interval.

Figure 6:
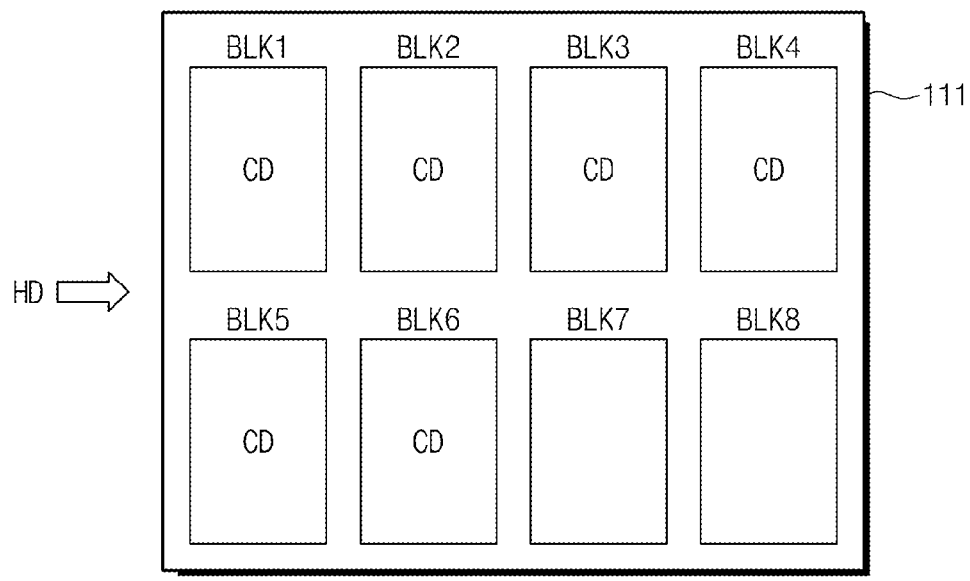
FIG. 6 is a conceptual diagram further illustrating one example of fast cycles phenomenon described in relation to FIG. 5.

FIG. 6 is a conceptual diagram illustrating one example of fast cycles, like the ones described in relation to FIG. 5. Referring to FIGS. 1, 2, 3, 4, 5 and 6, the memory cell array 111 is assumed to include first through eighth memory blocks BLK1 to BLK8. FIG. 6 shows a table listing a number of erase operations NOE and a number of fast cycles NOF for each one of the first through eighth memory blocks BLK1 to BLK8.

The first through sixth memory blocks BLK1 to BLK6 are here assumed to be programmed with cold data CD having a low update frequency. In contrast to cold data CD, hot data HD is data having a high update frequency. Since the cold data CD in the first through sixth memory blocks BLK1 to BLK6 is not updated in the illustrated example of FIG. 6, the counted number of erase operations NOE for each memory block is not incremented. Further, if there are no fast cycles executed for the first through sixth memory blocks BLK1 to BLK6, the counted number fast cycle NOF for the first to sixth memory blocks BLK1 to BLK6 will also not be incremented.

However, the seventh and eighth memory blocks BLK7 and BLK8 in the memory cell array 111 are assumed to be programmed with hot data HD while the first through sixth memory blocks BLK1 to BLK6 are maintained with cold data CD. When the hot data HD in the seventh and eighth memory blocks BLK7 and BLK8 is updated, erase operation(s) and/or program operation(s) may occur. When an erase operation is performed, the counted number of erase operations NOE is increased, and when an erase interval between two successive erase operations or two successive update operations directed to the seventh and eighth memory blocks BLK7 and BLK8 is less than an established minimal erase interval, the counted number of fast cycles NOF for the seventh and eighth memory blocks BLK7 and BLK8 is also increased.

In this context, a high counted number of fast cycles NOF for the memory cells of the seventh and eighth memory blocks BLK7 and BLK8 may degrade the reliability of data stored in these blocks.

According to certain embodiments of the inventive concepts, various methods of controlling the operation of a storage device in view of fast cycles associated with memory blocks BLK1 through BLK8 may improve the reliability of data stored in the storage device 100.

Figure 7:
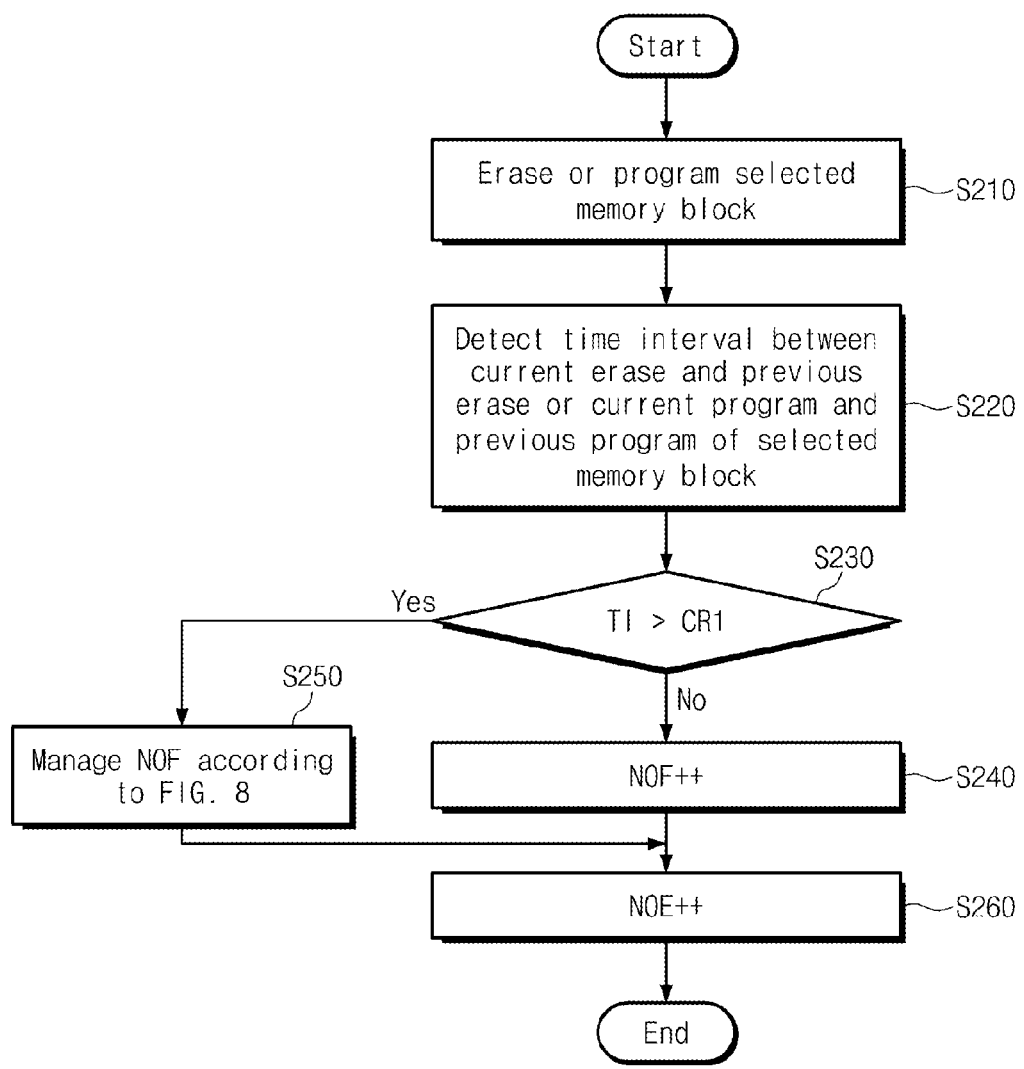
FIG. 7 is a flowchart summarizing one approach to a procedure for counting a fast cycle according to an embodiment of the inventive concept.

FIG. 7 is a flowchart illustrating one approach to a procedure for counting fast cycles according to an embodiment of the inventive concept. Referring to FIGS. 1 through 7, the procedure to count a fast cycle may correspond to the step S120 in FIG. 2.

The memory controller 120 causes an erase operation or a program operation (the "current" operation) to be executed in relation to a selected memory block (S210).

The memory controller 120 may then be used to detect a time interval TI between a previous erase operation and the current erase operation directed to the selected memory block, or between a previous program operation and the current program operation directed to memory cells of the selected memory block (S220). Here, the time interval TI may be detected by the time calculator 128.

The memory controller 120 may then be used to determine whether the detected time interval TI is greater than a first threshold value CR1 (S230). For example, the first threshold value CR1 may correspond to the limit such as the types described in FIG. 5.

If the detected time interval TI is less than or equal to the first threshold value CR1, the memory controller 120 will increment the counted number of fast cycles NOF for the selected memory block (S240). However, if the detected time interval TI is greater than the first threshold value CR1, the memory controller 120 may cause a procedure to be run that manages the number of fast cycles NOF for the selected memory block (S250). (See, e.g., the procedure of FIG. 8).

Further, when detected time interval TI is associated with two erase operations (S260), the memory controller 120 may be used to increase the counted number of erase operations NOE executed in relation to the selected memory block. But, when the time interval TI is associated with two program operations, step S260 may be skipped.

Figure 8:
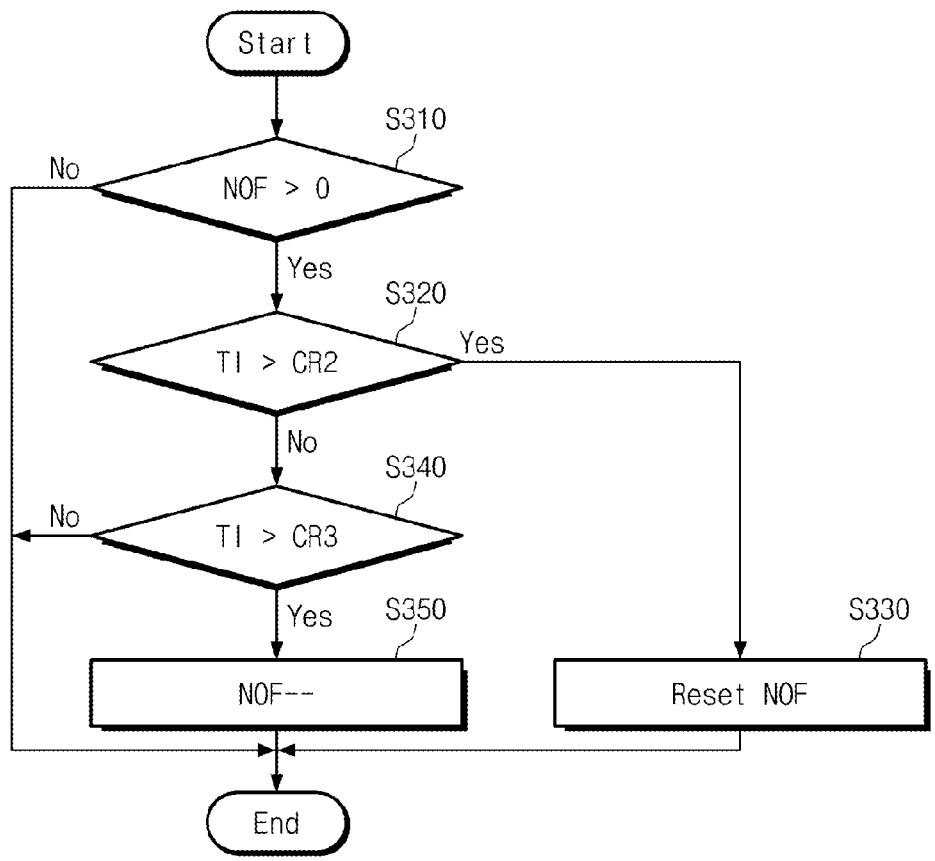
FIG. 8 is a flowchart summarizing one approach to a procedure for managing fast cycles for a selected memory block according to an embodiment of the inventive concept.

FIG. 8 is a flowchart summarizing one approach to a procedure for managing fast cycles for a selected memory block according to an embodiment of the inventive concept.

Referring to FIGS. 1 through 8, the memory controller 120 may be used to determine whether a counted number of fast cycles NOF for a selected memory block is greater than zero (S310). If the number of fast cycles NOF for the selected memory block is not greater than zero, the procedure ends.

However, when the number of fast cycles NOF for the selected memory block is greater than zero, the memory controller 120 will next determine whether the time interval TI is greater than a second threshold value CR2, where the second threshold value CR2 is greater than the first threshold value CR1 (S320). The second threshold value CR2 may be defined as an approximate time during which electrical charge trapped in an isolation layer of a previously programmed memory cell (or electrical charge trapped in an isolation layer near of a memory cell proximate the programmed memory cell) is liberated (or de-trapped). The second threshold value CR2 may be a predefined value or a variable value determined by a range of fast cycles NOF directed to the selected memory block. For example, the second threshold value CR2 may be increased or decreased in view of the number of fast cycles NOF for the selected memory block.

If the time interval TI is greater than the second threshold value CR2, the memory controller 120 will reset the counted number of fast cycles NOF (S330). When the time interval TI is not greater than the second threshold value CR2, the memory controller 120 will next determine whether the time interval TI is greater than a third threshold value CR3, where the third threshold value CR3 is greater than the first threshold value CR1 but less than the second threshold value CR2 (S340). In this regard, the third threshold value CR2 will be an approximate time during which electrical charge trapped in an isolation layer of a previously programmed memory cell (or electrical charge trapped in an isolation layer near of a memory cell proximate the programmed memory cell) becomes at least partially liberated.

If the time interval TI is not greater than the third threshold value CR3, the procedure ends. However, if the time interval TI is greater than the third threshold value CR3, the memory controller may be used to decrease the counted number of fast cycles NOF for the selected memory block (S350), whereupon the procedure is ended. The third threshold value CR3 may be a predefined value or a variable value determined by a range of fast cycles NOF directed to the selected memory block. For example, the third threshold value CR3 may be increased or decreased according to the number of fast cycles NOF for the selected memory block.

As described in FIGS. 7 and 8, the memory controller 120 may be configured to manage the number of erase operations NOE and/or the number of fast cycles NOF executed in relation to a selected memory block. That is, the memory controller 120 may manage the additional number of erase operations NOE and/or the additional number of fast cycles NOF directed to the selected memory block. For example, the memory controller 120 may direct additional fast cycle program operations and/or erase operations to a plurality of spare memory cells provided in the nonvolatile memory 110.

The memory controller 120 may manage the number of erase operations NOE and/or the number of fast cycles NOF directed to a selected memory block by loading the number of erase operations NOE and/or the number of fast cycles NOF for the selected memory block in the working memory 130. The loaded number of erase operations NOE and/or the loaded number of fast cycles NOF for the selected memory block may be copied from the working memory 130 to the nonvolatile memory 130 before power-off of the storage device 100.

Figure 9:
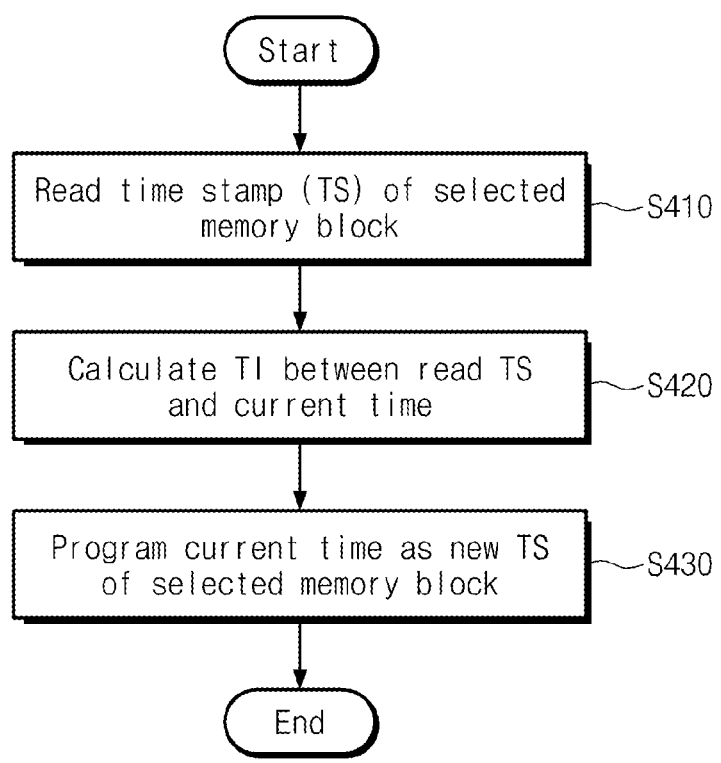
FIG. 9 is a flowchart summarizing one approach to a procedure for calculating a time interval for erase operation according to an embodiment of the inventive concept.

FIG. 9 is a flowchart summarizing in one approach a procedure for calculating a time interval between successive erase operations or program operations, as described for example in relation to FIG. 7, according to an embodiment of the inventive concept.

The procedure for calculating a time interval between erase operations or program operations may correspond to step S220 in FIGS. 7 and 8. Referring to FIGS. 1 through 9, the memory controller 120 may be used to read a time stamp TS for a selected memory block (S410). The time stamp TS may be an erase time stamp associated with a previously performed erase operation or a program time stamp associated with a previously performed program operation. For example, the time stamp TS may be a time associated with the execution of a last-executed erase operation or a last-executed program operation for the selected memory block. The time stamp TS may be calculated using the time calculator 128.

Time stamp TS data associated with a selected memory block may be stored in spare memory cells provided in the selected memory block, or it may be stored as meta data in a meta data area or meta data block. The meta data block may be a memory block used to store meta data. Such time stamp TS data may be managed by being loaded in the working memory 130.

The time calculator 128 may calculate a time interval TI between a previous erase operation time and a current erase operation time, or between a previous program operation time and a current program operation time as indicted by time stamp TS data read from (e.g.,) the selected memory block or the working memory 130 (S420).

The memory controller 120 may be used to store new time stamp TS data in relation to the execution of a current erase operation or a current program operation in the spare memory cells of the selected memory block, or as meta data in a meta data block, or in the working memory 130 of the storage device 100 (S430).

Figure 10:
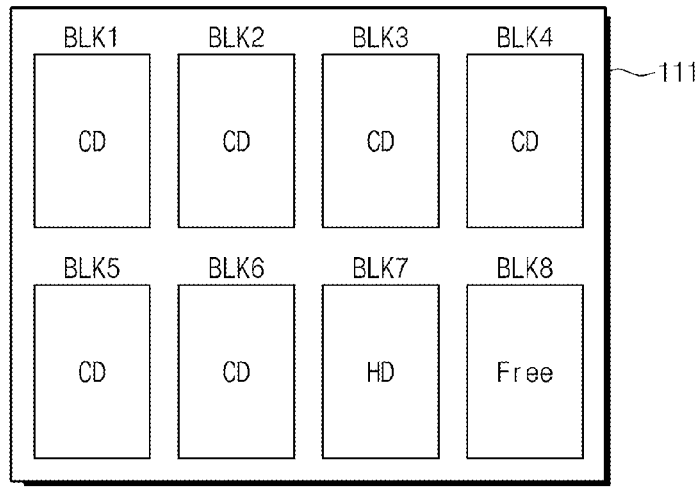
FIG. 10 is a table listing counted incidences of erase operations and fast cycles, as well as erase time stamps and wear indexes for memory blocks according to embodiment of the inventive concept.

FIG. 10 is a table listing respective numbers of erase operations NOEs, fast cycle NOFs, time stamps TSs, and wear indexes WIs for a plurality of memory blocks BLK1 through BLK8 according to embodiment of the inventive concept.

Referring to FIGS. 1 through 10, the memory cell array 111 is assumed to include memory blocks BLK1 to BLK8. Each of the memory blocks BLK1 to BLK8 will have some number of erase operations NOE, some number of fast cycles NOF, time stamp TS data, and a wear index XI associated with it.

The first to sixth memory blocks BLK1 to BLK6 may store cold data CD and a seventh memory block BLK7 may store hot data HD. An eighth memory block BLK8 may be a free block or an invalid block. The free block or the empty block may be a memory block which stores no valid data.

The memory controller 120 may manage the numbers of erase NOEs, the numbers of fast cycle NOFs, the time stamps TSs, and the wear indexes WIs for the plurality of memory blocks BLK1 to BLK8. A wear index WI may indicate degradation level or wear level of each of the memory blocks BLK1 to BLK8. The wear index WI may be calculated based on the number of erase operations NOE and/or the number of fast cycles NOF. For example, the wear index WI may be a weighted sum of the number of erase operations NOE and the number of fast cycles NOF. A large wear index may mean high degradation level or high wear level corresponding memory block.

The first and sixth memory blocks BLK1 to BLK6 having the cold data CD may have lower wear indexes WIs than a memory block having the hot data HD. For example, the first and sixth memory blocks BLK1 to BLK6 may have lower wear indexes WIs than the seventh and eighth memory blocks BLK7 and BLK8. The first and sixth memory blocks BLK1 to BLK6 may numbers of erase NOEs of two, three, two, one, three and four, respectively. The numbers of fast cycle NOFs of the first to sixth memory blocks BLK1 to BLK6 may be zero. The seventh and eighth memory blocks BLK7 to BLK8 may numbers of erase of ten and nine, respectively. The numbers of fast cycle NOFs of the seventh to eighth memory blocks BLK7 to BLK8 may be 6 and 5, respectively.

The fourth memory block BLK4 may have a first wear index WI1 that is lowest. The third memory block BLK3 may have a second wear index W12 that is higher than the first wear index WI1. The first memory block BLK1 may have a third wear index W13 that is higher than the second wear index W12. The second memory block BLK2 may have a fourth wear index W14 that is higher than the third wear index W13. The fifth memory block BLK5 may have a fifth wear index W15 that is higher than the fourth wear index W14. The sixth memory block BLK6 may have a sixth wear index W16 that is higher than the fifth wear index WI5. The eighth memory block BLK8 may have a seventh wear index W17 that is higher than the sixth wear index W16. The seventh memory block BLK7 may have a eighth wear index W18 that is higher than the seventh wear index W17.

The time stamps TSs of the first to eighth memory blocks BLK1 and BLK8 may indicate erase times each of which is a time point when an erase operation of a corresponding memory block is completed.

The first to sixth memory blocks BLK1 to BLK6 may have an old erase time stamp or a low erase time stamp for the cold data CD, when the erase time stamp increases while the time passes by. The seventh to eight memory blocks BLK7 to BLK8 may have a new erase time stamp or a high erase time stamp for the hot data HD, when the erase time stamp increases while the time passes by.

The fourth memory block BLK4 may have a first time stamp TS1 that is lowest or oldest. The third memory block BLK3 may have a second time stamp TS2 that is newer or higher than the first time stamp TS1. The first memory block BLK1 may have a third time stamp TS3 that is newer or higher than the second time stamp TS2. The second memory block BLK2 may have a fourth time stamp TS4 that is newer or higher than the third time stamp TS3. The fifth memory block BLK5 may have a fifth time stamp TS5 that is newer or higher than the fourth time stamp TS4. The sixth memory block BLK6 may have a sixth time stamp TS6 that is newer or higher than the fifth time stamp TS5. The eighth memory block BLK8 may have a seventh time stamp TS7 that is newer or higher than the sixth time stamp TS6. The seventh memory block BLK7 may have an eighth time stamp TS8 that is newer or higher than the seventh time stamp TS7.

Figure 11:
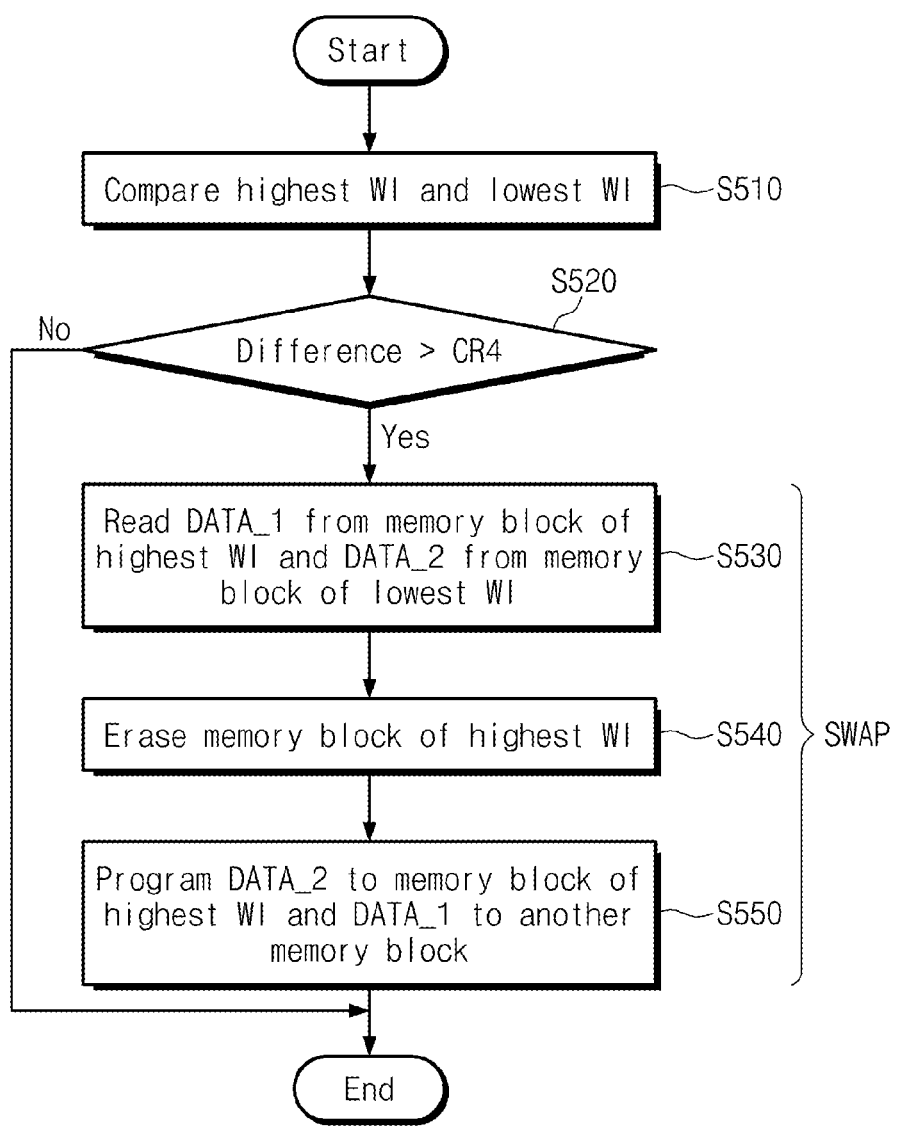
FIGS. 11 and 12 are respective flowcharts respectively summarizing in various approaches procedures for selecting a memory block to be erased (or to be programmed) according to an embodiment of the inventive concept.
Figure 12:
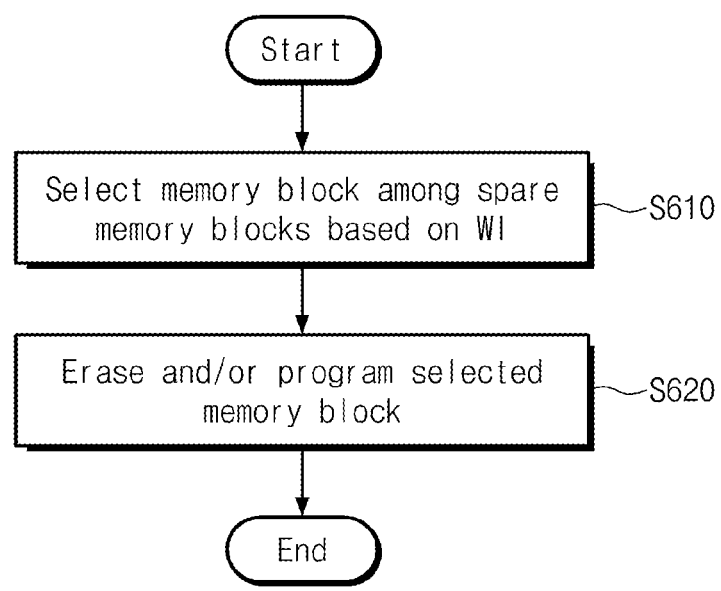

FIGS. 11 and 12 are flowcharts respectively summarizing in various approaches procedures for selecting a memory block to be erased (or to be programmed) according to an embodiment of the inventive concept.

The procedures for selecting a memory block to be erased (or to be programmed) may correspond to the step S130 described in FIG. 2. Referring to FIGS. 1 through 11, the memory controller 120 may be used to compare the highest wear index WI8 and the lowest wear index WI1 of the first through eighth wear indexes WI1 to WI8 for the memory blocks BLK1 to BLK8 (S510).

Then, the memory controller 120 may determine whether the difference between the highest wear index WI8 and the lowest wear index WI1 is greater than a fourth threshold value CR4 (S520). If the difference of the wear indexes WI8 and WI1 is greater than the fourth threshold value CR4, the memory controller 120 will read first data DATA_1 from the seventh memory block BLK7 having the highest wear index WI8 (S530). For example, the memory controller 120 may read all of the valid data stored in the seventh memory block BLK7 as first data DATA_1, and the first data DATA_1 read from the seventh memory block BLK7 may be stored in the working memory 130.

The memory controller 120 may read second data DATA_2 from the fourth memory block BLK4 having the lowest wear index WI1. For example, the memory controller 120 may read all of the valid data stored in the fourth memory block BLK4 as the second data DATA_2. The second data DATA_2 read from the fourth memory block BLK4 may be stored in the memory 130 temporarily and copied to the seventh memory block BLK7.

The memory controller 120 may be used to erase the seventh memory block BLK7 that has the highest wear index WI8 (S540).

The memory controller 120 may move second data DATA_2 from the fourth memory block BLK4 having the lowest wear index WI1 to the seventh memory block BLK7 having the highest wear index WI8 (S550). For example, the memory controller 120 may read all of the valid data stored in the fourth memory block BLK4 as the second data DATA_2, and the second data DATA_2 read from the fourth memory block BLK4 may be temporarily stored in the memory 130 and copied to the seventh memory block BLK7.

The memory controller 120 may program the first data DATA_1 stored in the memory 130 to a memory block having sufficient empty space to store the first data DATA_1. For example, the memory controller 120 may program the first data DATA_1 into the fourth memory block BLK4 after erasing the fourth memory block having the lowest wear index WI1. The memory controller 120 may program the first data DATA_1 into the eighth memory block BLK8 after erasing the eighth memory block BLK8.

In the context of the illustrated example of FIGS. 11 and 12, steps S530, S540 and S550 constitute a swap operation. During execution of the swap operation, the second data DATA_2, which may be the cold data CD stored in the fourth memory block BLK4 having the lowest wear index WI1, may be exchanged with the first data DATA_1, which may be the hot data HD stored in the eighth memory block BLK8 having the lowest wear index WI1.

In this manner, the possibility of additional erase operations and/or program operations being directed to the seventh block BLK7 may be reduced because the cold, first DATA_2 has a lower possibility of being updated. Thus, the number of fast cycles NOF directed to the seventh memory block BLK7 may be reduced and/or the counted number of fast cycles NOF directed to the seventh memory block BLK7 may be reset.

The sequence order of reading the first data DATA_1, reading the second DATA_2, programming the first data DATA_1, and programming the second data DATA_2 described in FIG. 11 may be reordered according to the memory configuration or efficiency of data transfer in the storage device 100. For example, reading the second data DATA_2 from the fourth memory block BLK4 may be performed after erasing the seventh memory block BLK7. In addition, when a selected memory block to program the first data DATA_1 or the second data DATA_2 is already erased, the erase step, S540 may be skipped.

Referring now to FIGS. 1 through 12, the memory non-volatile memory 110 is assumed to provide a plurality of spare memory blocks and the memory controller 120 may select one of the spare memory blocks to be erased based on a wear index WI of the invalid memory blocks (S610). A spare memory block is a memory block that currently stores no valid data, and may alternately be termed a free memory block, an empty memory block, an invalid memory block, etc. For example, the memory controller 120 may select a memory block having the lowest or the highest wear index memory block to be erased out of spare memory blocks. The memory controller 120 may select a spare memory block based on the characteristic of data to be programmed into the selected spare memory block. The characteristic of data may be whether the data is cold data CD or hot data HD. The memory controller 120 may select a spare memory block based on wear indexes of spare memory blocks.

Then, the memory controller 120 may erase the selected memory block (S620). For example, if data to be programmed is cold data CD, the memory controller 120 may select a memory block having the highest wear index WI of the spare memory blocks to be erased and may erase the selected memory block. If data to be programmed is hot data CD, the memory controller 120 may select a memory block having the lowest wear index WI of the spare memory blocks to be erased and may erase the selected memory block. When the memory block selected in step S610 is already erased, the erase step S620 may be skipped.

Figure 13:
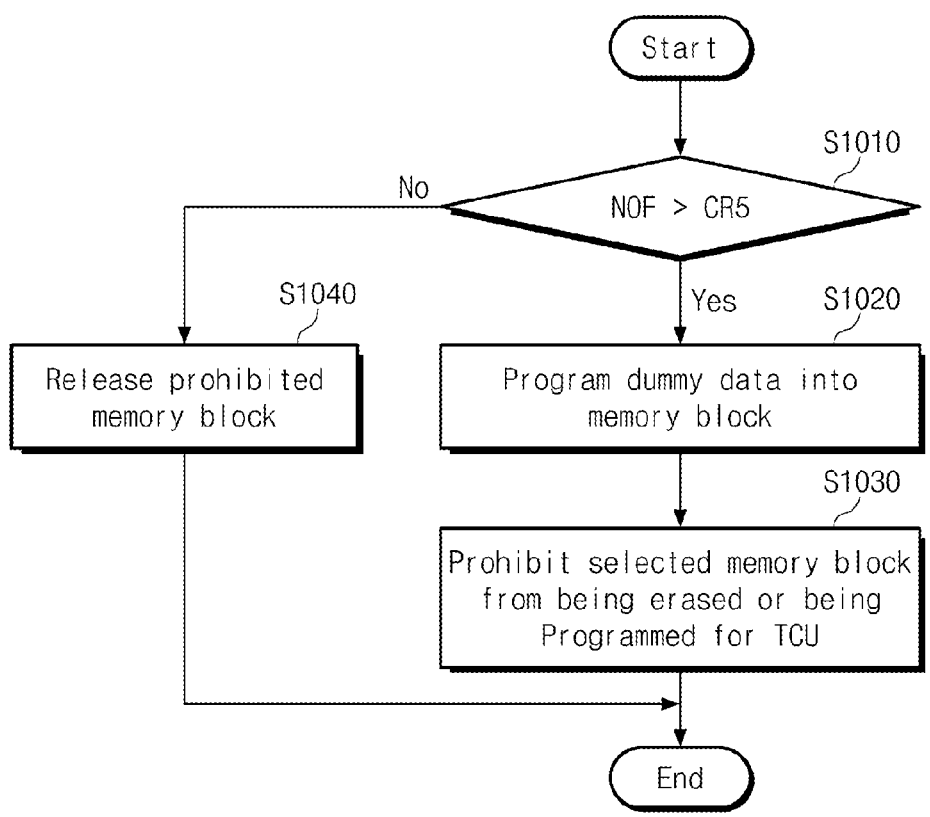
FIG. 13 is a flowchart summarizing in one approach certain procedures for scheduling an erase operation or program operation directed to a memory block based on a number of fast cycles according to an embodiment of the inventive concept.

FIG. 13 is a flowchart summarizing in one approach certain procedures for scheduling an erase operation or a program operation directed to a memory block based on a number of fast cycles NOF according to an embodiment of the inventive concept.

Referring now to FIGS. 1 through 13, the memory controller 120 may be used to determine whether the number of fast cycles NOF for a selected memory block is greater than a fifth threshold value or prohibition threshold value CR5 (S1010). The selected memory threshold block may be a programmed memory block or an erased memory block.

When the number of fast cycles NOF is greater than the sixth threshold value CR6, the memory controller 120 will program dummy data to the selected memory block (S1020). For example, a dummy data pattern may be used that includes data having a predefined pattern. That is, the memory controller 120 may program a plurality of memory cells of the selected memory block so that the memory cells may have a higher threshold voltage than a distribution range of threshold voltages for memory cells in an erased state.

The memory controller 120 may then be used to "prohibit" the selected memory block from being programmed or erased during a cure time interval (TCU) (S1030). In this context, the selected memory block is classified as a "prohibited memory block".

The cure time interval is a time period necessary to avoid the fast cycle phenomenon, as described above, where after a once prohibited memory block may be re-designated (or "released") as a normal or non-prohibited memory block capable of being erased or programmed. The cure time interval may be predefined or may be determined based on the counted number of fast cycles NOF for the selected memory block.

On the other hand, the memory controller 120 may simply select only memory blocks that are not prohibited memory blocks to be erased or be programmed.

The procedure of FIG. 13 may be scheduled by the memory controller 120 by combining with the method of managing the number of fast cycles NOF described in FIG. 8. The memory controller 120 may manage the number of fast cycles NOF for a prohibited memory block once the cure time interval has passed. When the number of fast cycles NOF for a selected memory block—which may be a prohibited memory block—is not greater than the fifth threshold value CR5, the prohibited memory block may be released from the prohibition and be classified as a non-prohibited memory block (S1040).

In the foregoing example, step S1020 may be skipped when there is no need to program the dummy pattern into the selected memory block. In this case, when the number of fast cycles NOF is greater than the fifth threshold value CR5, the memory controller 120 may prohibit the selected memory block from being erased or being programmed. That is, step S1020 may be skipped in view of a characteristic or condition of the nonvolatile memory 110.

The fifth threshold value CR5 may be less than the second threshold value CR2 but greater than the third threshold value CR3 described in FIG. 8.

Figure 14:
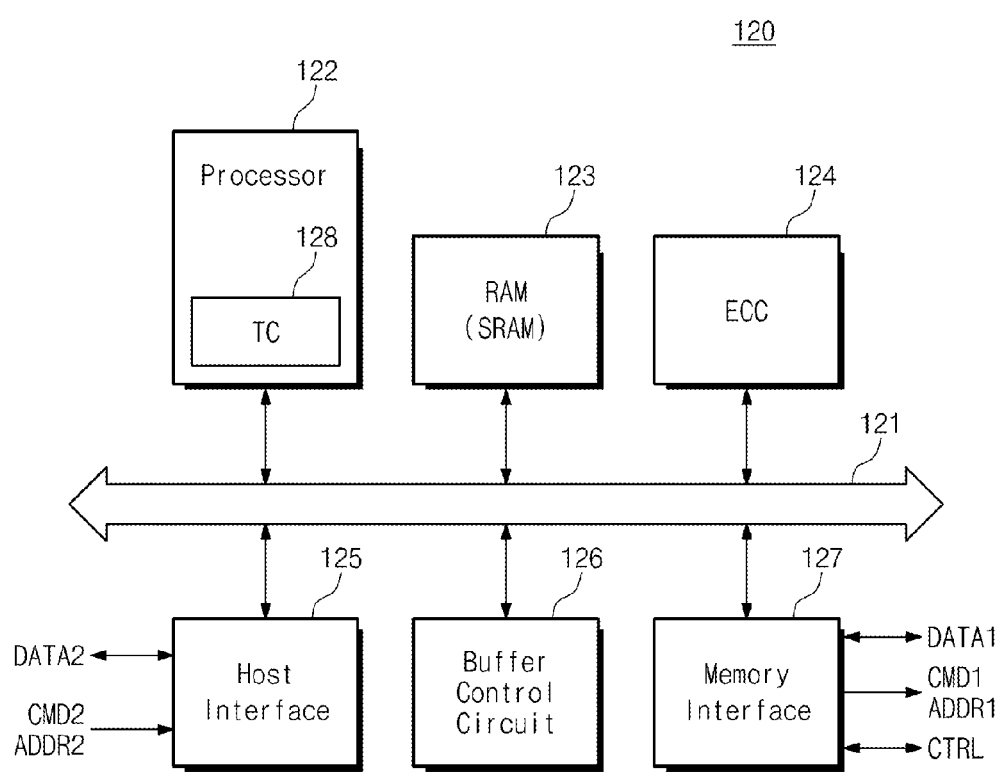
FIG. 14 is a block diagram further illustrating in a memory controller 120 according to an embodiment of the inventive concept.

FIG. 14 is a block diagram further illustrating in one example the memory controller 120 of FIG. 1 according to an embodiment of the inventive concept. Referring to FIGS. 1 to 14, a memory controller 120 comprises a bus 121, a processor 122, a RAM 123, an ECC block 124, a host interface 125, a buffer control circuit 126, and a memory interface 127.

The bus 121 may be configured to provide a channel among components of the memory controller 120.

The processor 122 controls an overall operation of the memory controller 120 and executes a logical operation. The processor 122 communicates with a host device through the host interface 125. The processor 122 stores, in the RAM 123, a second command CMD2 or a second address ADDR2 received through the host interface 125. The processor 122 produces a first command CMD1 and a first address ADDR1 according to the second command CMD2 or the second address ADDR2 stored in the RAM 123. The processor 122 outputs the first command CMD1 and the first address ADDR1 through the memory interface 127.

The processor 122 outputs the second data DATA2 received from the host interface 125 through the buffer control circuit 126 or stores it in the RAM 123. The processor 122 outputs, through the memory interface 127, data stored in the RAM 123 or data received through the buffer control circuit 126. The processor 122 stores the first data DATA1 received through the memory interface 127 in the RAM 123 or outputs it through the buffer control circuit 126. Under a control of the processor 122, data stored in the RAM 123 or data received through the buffer control circuit 126 is output through the host interface 125 as the second data DATA2 or is output through the memory interface 127 as the first data DATA1.

The processor 122 may include a time calculator 128 according to an embodiment of the inventive concept. The time calculator 128 may be embodied as a software executed by the processor 122 or a part of the processor 122 as a hardware.

The RAM 123 is used as a working memory, a cache memory, or a buffer memory of the processor 122. The RAM 123 stores codes or instructions that the processor 122 will execute. The RAM 123 stores data processed by the processor 122. The RAM 123 may include an SRAM.

The ECC block 124 performs an error correction operation. The ECC block 124 generates parity for error correction, based on first data DATA1 to be output to the memory interface 127 or second data DATA2 received from the host interface 125. The first data DATA1 and parity may be output through the memory interface 127. The ECC block 124 corrects an error of first data DATA1 using the first data DATA1 and parity that are received through the memory interface 127. The ECC block 124 may be implemented as a component of the memory interface 127.

The host interface 125 communicates with the host device according to a control of the processor 122. The host interface 125 receives the second command CMD2 and the second address ADDR2 from the host device and exchanges the second data DATA2 with the host device.

The host interface 125 may communicate using at least one of various communication manners, such as Universal Serial Bus (USB), Serial AT Attachment (SATA), High Speed Interchip (HSIC), Small Computer System Interface (SCSI), Firewire, Peripheral Component Interconnection (PCI), PCI express (PCIe), Nonvolatile Memory express (NVMe), Universal Flash Storage (UFS), Secure Digital (SD), Multi-Media Card (MMC), and embedded MMC (eMMC)).

The buffer control circuit 126 is configured to control a RAM 123 (refer to FIG. 1) according to a control of the processor 122. The buffer control circuit 126 writes data at the RAM 130 and reads data therefrom.

The memory interface 127 is configured to communicate with a nonvolatile memory 110 (refer to FIG. 1) according to a control of the processor 122. The memory interface 127 sends a first command CMD1 and a first address ADDR1 to the nonvolatile memory 110 and exchanges first data DATA1 and a control signal CTRL with the nonvolatile memory 110.

In embodiments, a storage device 100 may be configured not to include the RAM 130. That is, the storage device 100 does not have the memory controller 120 and the nonvolatile memory 110 at the outside. In this case, the memory controller 120 does not include the buffer control circuit 126. A function of the RAM 130 is carried out using the RAM 123 of the memory controller 120.

In embodiments, the processor 122 controls the memory controller 120 using codes. The processor 122 may load codes from a nonvolatile memory (e.g., read only memory) that is implemented in the memory controller 120. Or, the processor 122 may load codes received from the memory interface 127.

In embodiments, the bus 121 of the memory controller 120 is divided into a control bus and a data bus. The data bus transfers data in the memory controller 120, and the control bus is configured to transfer control information in the memory controller 120: a command and an address. The data bus and the control bus are separated to prevent mutual interference or influence. The data bus is connected with the host interface 125, the buffer control circuit 126, the ECC block 124, and the memory interface 127. The control bus is connected with the host interface 125, the processor 122, the buffer control circuit 126, the RAM 123, and the memory interface 127.

Although the inventive concept has been described with reference to embodiments thereof, it will be understood by those of ordinary skill in the art that various changes in forms and details may be made thereto without departing from the scope of the inventive concept as defined by the following claims.

What is claimed is:

1. A method of operating a storage device including a memory controller and a nonvolatile memory including a memory block, the method comprising:
   counting a number of fast cycles for the memory block when a program interval between two successive program operations directed to memory cells of the memory block is less than a minimal program interval, and/or when an erase interval between two successive erase operations directed to the memory block is less than a minimal erase interval; and
   selecting the memory block to be erased by an erase operation or selecting memory cells of the memory block to be programmed by a program operation in response to the counted number of fast cycles for the memory block.

2. The method of claim 1, wherein the counting of fast cycles for the memory block comprises:
   executing a current erase operation directed to the memory block;
   determining the erase time interval between execution of the current erase operation and execution of a previous erase operation directed to the memory block; and
   comparing the erase time interval to a first threshold value.

3. The method of claim 2, wherein the counting of fast cycles for the memory block comprises:
   resetting the number of fast cycles for the memory block when the erase time interval is greater than a second threshold value that is greater than the first threshold value.

4. The method of claim 2, wherein the counting of fast cycles for the memory block comprises:
   decreasing the counted number of fast cycles for the memory block when the erase time interval is greater than a third threshold value that is greater than the first threshold value.

5. The method of claim 2, wherein the determining of the erase time interval comprises:
   reading at least one time stamp for the selected memory block; and
   calculating the erase time interval between the current erase operation and the at least one time stamp.

6. The method of claim 5, further comprising:
   updating the time stamp for the selected memory block with a time at which the current erase operation is completed.

7. The method of claim 1, wherein the counting of fast cycles for the memory block comprises:
   performing a current programming operation directed to the memory block;
   detecting the program interval between a current program operation directed to memory cells of the memory block and a previous program operation directed to memory cells of the memory block;
   and
   increasing the counted number of fast cycles for the memory block when the program interval is less than the first threshold value.

8. The method of claim 7, wherein the detecting of the program interval comprises:
   reading at least one time stamp for the memory block; and
   calculating a time interval between a time when the current program operation is completed and the at least one time stamp.

9. The method of claim 8, wherein the at least one time stamp indicates a time at which the current program operation is completed for a first word line of the memory block.

10. The method of claim 8, wherein the at least one time stamp indicates a time at which the current program operation is completed for a last word line of the memory block.

11. The method of claim 8, wherein the at least one time stamp indicates an average of total program operation times for memory cells connected to a plurality of word lines in the memory block by the current program operation.

12. A method of operating a storage device including a memory controller and a nonvolatile memory including a plurality of memory blocks, the method comprising:
   respectively counting a number of fast cycles for each one of the plurality of memory blocks when a program interval between two successive program operations directed to memory cells of each memory block is less than a minimal program interval, and/or when an erase interval between two successive erase operations directed to each of the memory blocks is less than a minimal erase interval;

calculating a wear index for each one of the plurality of memory blocks based on the counted number of fast cycles for each one of the plurality of memory blocks, and a number of erase operations directed to each one of the plurality of memory blocks; and selecting a memory block from among the plurality of memory blocks to be erased by an erase operation or selecting memory cells of the memory block to be programmed by a program operation in response to the counted number of fast cycles for the selected memory block.

13. The method of claim 12, wherein the selecting of the memory block from among the plurality of memory is performed further in response to a wear index for the selected memory block.

14. The method of claim 13, further comprising:

reading first data from a first memory block having the highest wear index among the plurality of memory blocks;

reading second data from a second memory block having the lowest wear index among the plurality of memory blocks;

programming the first data to a third memory block;

erasing the first memory block; and programming the second data to the erased first memory block.

15. The method of claim 12, wherein the selecting of the memory block from among the plurality of memory blocks comprises selecting the memory block having a lowest wear index for a plurality of spare memory blocks.

16. A method of operating a nonvolatile memory device having a memory cell array divided into memory blocks, the method comprising:

counting a number of fast cycles for each one of the memory blocks when a program interval between two successive program operations directed to memory cells of each memory block is less than a minimal program interval, and/or when an erase interval between two successive erase operations directed to each memory block is less than a minimal erase interval; and selecting a memory block among the memory blocks to be erased by an erase operation or selecting memory cells of the memory block to be programmed by a program operation in response to the counted number of fast cycles for the memory block.

17. The method of claim 16, further comprising:

prohibiting the erase operation or the program operation when the selected memory block has a counted number of fast cycles greater than a prohibition threshold value.

18. The method of claim 17, further comprising:

releasing prohibition of the selected memory block for the erase operation or the program operation following a cure time interval.

19. The method of claim 18, further comprising:

programming dummy data to the selected memory block.

20. The method of claim 18, wherein the cure time interval is determined by referencing at least one time stamp associated with the selected memory block.

* * * * *